US011038509B2

(12) United States Patent
Takahashi et al.

(10) Patent No.: US 11,038,509 B2
(45) Date of Patent: Jun. 15, 2021

(54) CIRCUIT DEVICE, OSCILLATOR, REAL-TIME CLOCK DEVICE, ELECTRONIC DEVICE, AND VEHICLE

(71) Applicant: Seiko Epson Corporation, Tokyo (JP)

(72) Inventors: Tomoaki Takahashi, Minowa (JP); Yasuhiro Sudo, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/999,318

(22) Filed: Aug. 21, 2020

(65) Prior Publication Data

US 2021/0058088 A1    Feb. 25, 2021

(30) Foreign Application Priority Data

Aug. 22, 2019  (JP) .............................. JP2019-151762

(51) Int. Cl.

| | |
|---|---|
| *H03L 1/02* | (2006.01) |
| *H03B 5/24* | (2006.01) |
| *H03M 1/66* | (2006.01) |
| *G04F 1/06* | (2006.01) |
| *G04F 10/00* | (2006.01) |
| *G06N 20/00* | (2019.01) |

(52) U.S. Cl.
CPC .................. *H03L 1/02* (2013.01); *G04F 1/06* (2013.01); *G04F 10/005* (2013.01); *G06N 20/00* (2019.01); *H03B 5/24* (2013.01); *H03M 1/66* (2013.01); *H03B 2200/005* (2013.01)

(58) Field of Classification Search
CPC ...... H03B 5/24; H03B 2200/005; H03B 5/32; H03L 1/02; H03M 1/66; G04F 1/06; G06N 20/00
USPC .................................... 331/158, 116 FE, 176
See application file for complete search history.

(56) References Cited

U.S. PATENT DOCUMENTS

2018/0241344 A1*  8/2018  Kiyohara ................. H03B 5/04

FOREIGN PATENT DOCUMENTS

JP        H05-218738 A        8/1993

* cited by examiner

*Primary Examiner* — Arnold M Kinkead
(74) *Attorney, Agent, or Firm* — Harness, Dickey & Pierce, P.L.C.

(57) ABSTRACT

A circuit device includes an oscillation circuit and a processing circuit. The oscillation circuit includes a variable capacitance circuit configured by a capacitor array and oscillates at an oscillation frequency corresponding to the capacitance value of the variable capacitance circuit. First temperature data and second temperature data subsequent to the first temperature data are input to the processing circuit as temperature data. In the period between the start of the capacitance control based on the first temperature data and the start of the capacitance control based on the second temperature data, the processing circuit switches the first capacitance control data corresponding to the first temperature data and the second capacitance control data different from the first capacitance control data in a time-division manner to be output to the variable capacitance circuit.

14 Claims, 15 Drawing Sheets

FIG. 7 the disclosure of which is here by incorporated by
CIRCUIT DEVICE, OSCILLATOR, REAL-TIME CLOCK DEVICE, ELECTRONIC DEVICE, AND VEHICLE The present application is based on, and claims priority from JP Application Serial Number 2019-151762, filed Aug. 22, 2019, the disclosure of which is here by incorporated by reference here in its entirety.

BACKGROUND

1. Technical Field

The present disclosure relates to a circuit device, an oscillator, a real-time clock device, an electronic device, a vehicle, and the like.

2. Related Art

In an oscillator that temperature compensates an oscillation frequency, a technique is known in which the capacitance value of a capacitor array included in an oscillation circuit is switched according to temperature. Such a technique is disclosed in JP-A-5-218738. In JP-A-5-218738, in order to perform precise control using a small number of capacitance elements, a quartz crystal oscillator includes a plurality of first capacitance elements having the same capacitance value and a second capacitance element having a capacitance value of 1/(n+1) with respect to the capacitance value of the first capacitance element. A capacitor array is configured by a plurality of first capacitance elements and a second capacitance element, and the oscillation frequency is temperature-compensated by switching the capacitance value of the capacitor array according to the temperature.

In the temperature compensation method as described above, when the resolution of capacitance switching of the capacitor array is insufficient, the accuracy of temperature compensation is reduced, and thus the frequency deviation of the oscillation frequency may increase. In order to increase the resolution of capacitance switching, it is conceivable to reduce the capacitance value of the capacitance element as in JP-A-5-218738. However, when the capacitance value of the capacitance element is reduced, the variation in capacitance value increases, and the variation in capacitance value may reduce the accuracy of temperature compensation.

SUMMARY

A circuit device according to an aspect of the present disclosure includes an oscillation circuit that includes a variable capacitance circuit configured by a capacitor array and oscillates at an oscillation frequency corresponding to a capacitance value of the variable capacitance circuit, and a processing circuit to which temperature data obtained by A/D converting a temperature detection voltage from a temperature sensor is input and that performs capacitance control on the variable capacitance circuit based on the temperature data, in which the processing circuit receives first temperature data as the temperature data and second temperature data subsequent to the first temperature data and switches first capacitance control data corresponding to the first temperature data and second capacitance control data different from the first capacitance control data in a time-division manner in a period between a start of capacitance control based on the first temperature data and a start of capacitance control based on the second temperature data to be output to the variable capacitance circuit.

BRIEF DESCRIPTION OF THE DRAWINGS

FIG. 7 is an example of a second table.

DESCRIPTION OF EXEMPLARY EMBODIMENTS

Hereinafter, a preferred embodiment of the present disclosure will be described in detail. It should be noted that the present embodiment described below does not unreasonably limit the contents described in the appended claims, and all the configurations described in the present embodiment are not necessarily essential constituent elements.

1. Circuit Device

Figure 1:
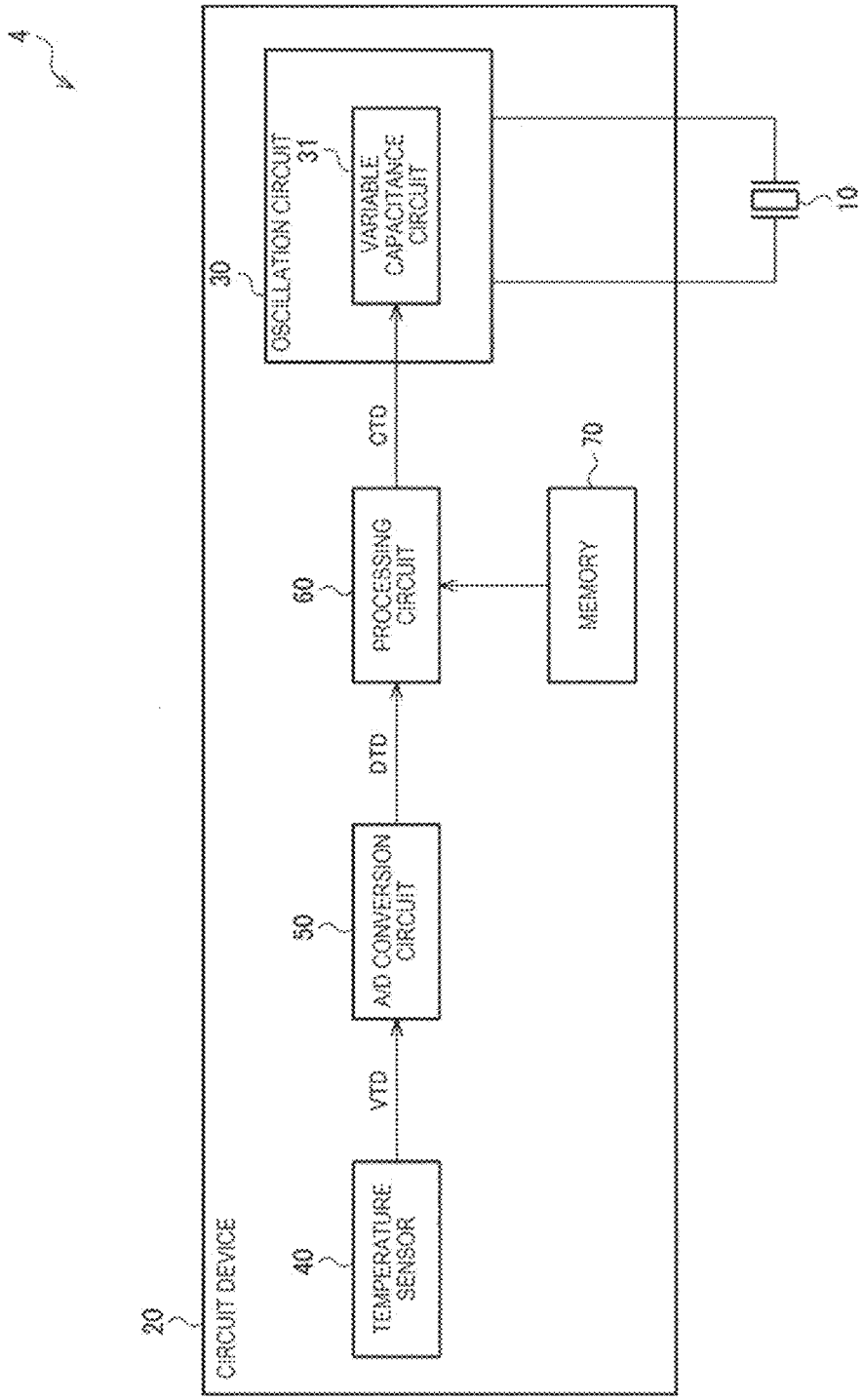
FIG. 1 is a configuration example of a circuit device and an oscillator.

FIG. 1 is a configuration example of a circuit device 20 and an oscillator 4 of the present embodiment. The oscillator 4 includes a circuit device 20 and a resonator 10.

The circuit device 20 is an integrated circuit device called integrated circuit (IC). For example, the circuit device 20 is an IC manufactured by a semiconductor process, and is a semiconductor chip having a circuit element formed on a semiconductor substrate. The circuit device 20 includes an oscillation circuit 30, a temperature sensor 40, an A/D conversion circuit 50, a processing circuit 60, and a memory 70. The temperature sensor or the temperature sensor and the A/D conversion circuit may be provided outside the circuit device 20. In this case, a temperature detection voltage or temperature data is externally input to the circuit device 20.

The temperature sensor 40 is a sensor that detects temperature. Specifically, the temperature sensor 40 outputs a temperature detection voltage VTD whose voltage value changes according to the temperature by using the temperature dependence of the forward voltage of a PN junction. For example, the temperature sensor 40 includes a bipolar transistor and a constant current source. The collector and base of the bipolar transistor are coupled, and the constant current source outputs a constant current to the collector. The temperature sensor 40 outputs the base-emitter voltage of the bipolar transistor as the temperature detection voltage VTD.

The A/D conversion circuit 50 performs A/D conversion of the temperature detection voltage VTD and outputs the result as temperature data DTD. As the A/D conversion method of the A/D conversion circuit 50, various methods such as a successive approximation type, a parallel comparison type, and a ΔΣ type can be adopted.

The oscillation circuit 30 includes a variable capacitance circuit 31 configured by a capacitor array, and oscillates at an oscillation frequency corresponding to the capacitance value of the variable capacitance circuit 31. The oscillation frequency is temperature-compensated by controlling the capacitance value of the variable capacitance circuit 31 so that the oscillation frequency is constant with respect to the temperature fluctuation. The oscillation circuit 30 oscillates the resonator 10 electrically coupled to the oscillation circuit 30. Specifically, the circuit device 20 includes a first terminal and a second terminal, one end of the resonator 10 is coupled to the oscillation circuit 30 via the first terminal, and the other end of the resonator 10 is coupled to the oscillation circuit 30 via the second terminal. As the oscillation circuit 30, various types of oscillation circuits such as a Pierce type, a Colpitts type, an inverter type or a Hartley type can be used.

The processing circuit 60 controls the capacitance of the variable capacitance circuit 31 based on the temperature data DTD. Specifically, the processing circuit outputs capacitance control data CTD to the variable capacitance circuit 31 based on the temperature data DTD and the information stored in the memory 70. As a result, the capacitance value of the variable capacitance circuit is set to the capacitance value specified by the capacitance control data CTD.

The memory 70 stores information used when the processing circuit 60 generates the capacitance control data CTD based on the temperature data DTD. The information stored in the memory 70 is a capacitance adjustment value and time-division data described later. The memory 70 is a non-volatile memory. In this case, the above information is written in the non-volatile memory when the oscillator 4 is manufactured. The non-volatile memory may be, for example, an electrically erasable programmable read only memory (EEPROM), a flash memory, or a fuse memory. Alternatively, the memory 70 may be a random access memory (RAM) or a register. In this case, the above information is written in the RAM or a register from an external host device or the like.

The resonator 10 is an element that generates mechanical vibration by an electrical signal. The resonator 10 can be realized by a resonator element such as a quartz crystal resonator element. For example, the resonator 10 can be realized by a quartz crystal resonator element whose cut angle resonates in a thickness-shear manner such as AT cut or SC cut. For example, the resonator 10 may be a resonator built in a temperature compensated crystal oscillator (TCXO) having no constant thermostatic chamber. Alternatively, the resonator 10 may be a resonator built in a constant thermostatic chamber type quartz crystal oscillator (OCXO) having a constant thermostatic chamber, and the resonator 10 of the present embodiment can be realized by various resonator elements such as a resonator element other than the thickness-shear resonation type or a piezoelectric resonator element made of a material other than quartz crystal. For example, as the resonator 10, a surface acoustic wave (SAW) resonator, a micro electro mechanical systems (MEMS) resonator as a silicon resonator formed by using a silicon substrate, or the like may be adopted.

The connection in the present embodiment is an electrical connection. The electrical connection is a connection in which an electrical signal can be transmitted, and is a connection in which information can be transmitted by the electrical signal. The electrical connection may be a connection via a passive element or an active element.

Figure 2:
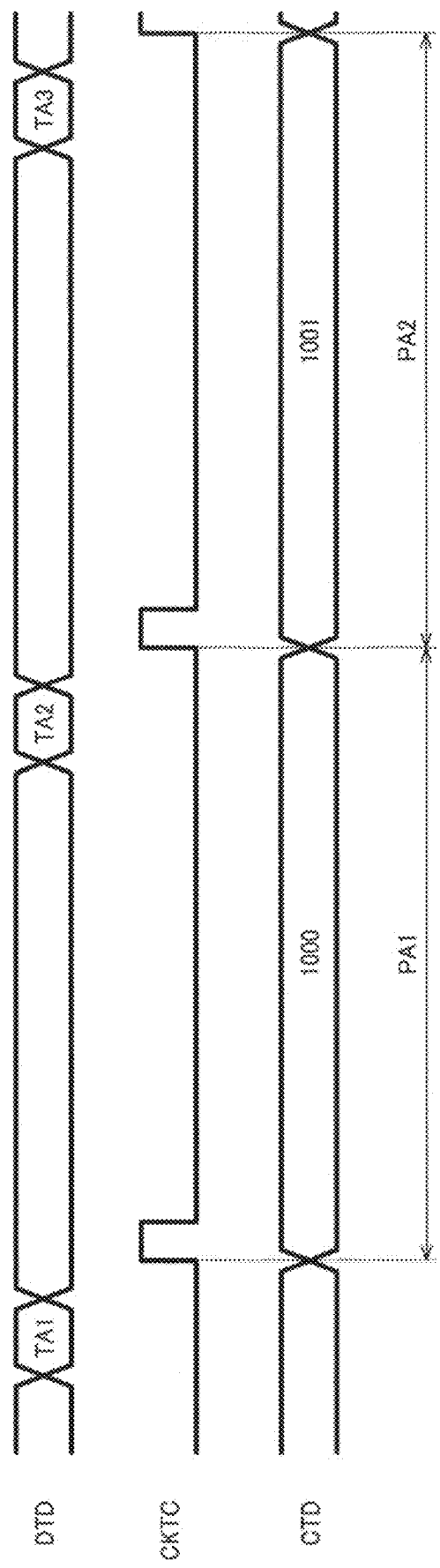
FIG. 2 is a signal waveform example when a capacitance of a variable capacitance circuit is not time-division controlled as a comparative example of the present embodiment.

FIG. 2 illustrates an example of a signal waveform when the capacitance of the variable capacitance circuit 31 is not time-division controlled, as a comparative example of the present embodiment. In FIG. 2, the capacitance control data CTD is illustrated by a decimal number.

The A/D conversion circuit 50 outputs temperature data TA1, TA2, TA3 at each sampling cycle. The processing circuit 60 outputs capacitance control data "1000" based on the temperature data TA1 in a period PA1, and outputs capacitance control data "1001" based on the temperature data TA2 in a next period PA2. The periods PA1 and PA2 are periods defined by a temperature control clock signal CKTC, and the cycle thereof is the same as the sampling cycle of the A/D conversion circuit 50. The temperature control clock signal CKTC is an internal signal of the processing circuit 60.

It is assumed that the capacitance value of the variable capacitance circuit 31 can be switched in increments C0, and the capacitance value of the variable capacitance circuit 31 is set to CTD×C0 with respect to the capacitance control data CTD. In this case, the capacitance value of the variable capacitance circuit 31 is 1000×C0 in the period PA1 and 1001×C0 in the period PA2.

In the present comparative example, as described above, one capacitance control data CTD is output for one temperature data DTD. Therefore, the capacitance value of the variable capacitance circuit 31 cannot be adjusted in increments smaller than C0. For example, in the example of FIG. 2, the capacitance value of the variable capacitance circuit 31 cannot be adjusted between 1000×C0 and 1001×C0.

Figure 3:
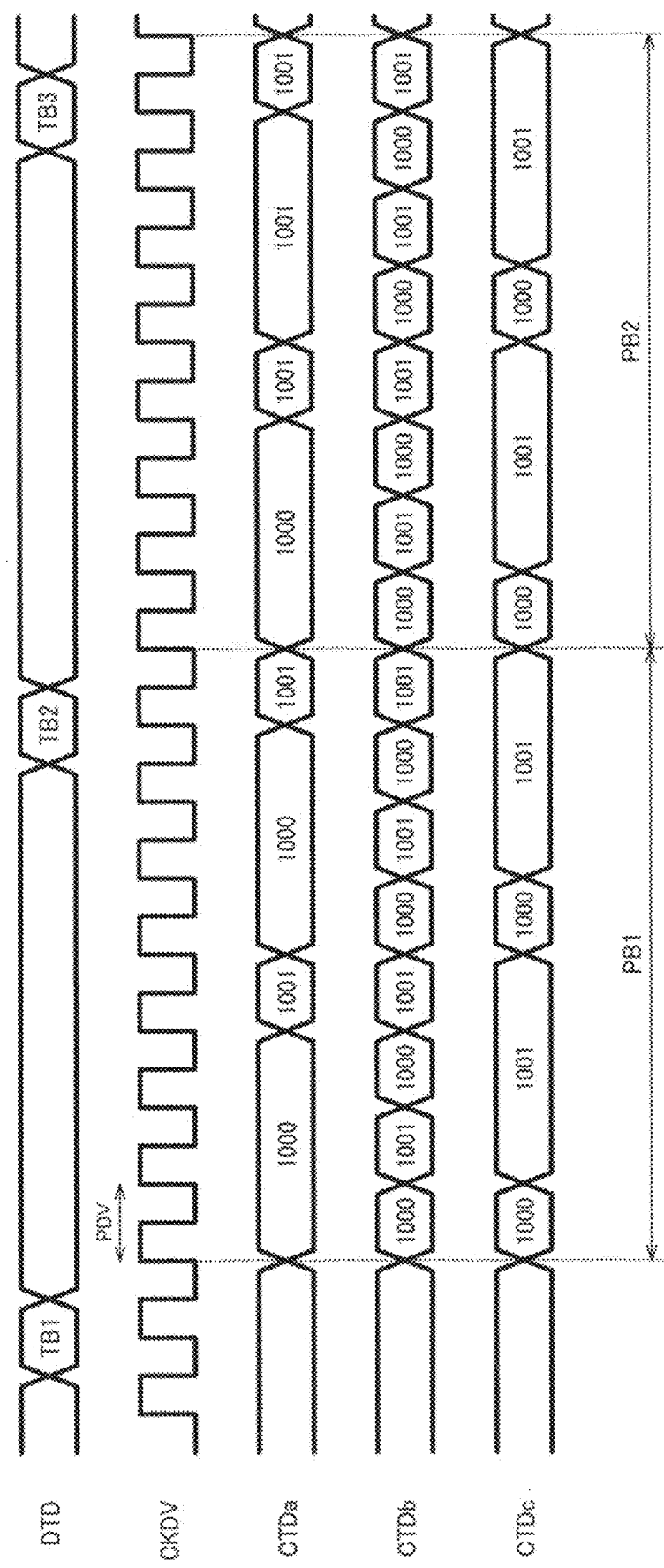
FIG. 3 is signal waveform examples illustrating an operation of the circuit device according to the present embodiment.

FIG. 3 is signal waveform examples illustrating an operation of the circuit device 20 according to the present embodiment. In FIG. 3, the capacitance control data CTD is illustrated by a decimal number. FIG. 3 illustrates a first waveform example CTDa, a second waveform example CTDb, and a third waveform example CTDc as waveform examples of the capacitance control data CTD.

The A/D conversion circuit 50 outputs first temperature data TB1, second temperature data TB2, and third temperature data TB3 for each sampling cycle. In the period PB1, the processing circuit 60 outputs the first capacitance control data "1000" and the second capacitance control data "1001" in a time-division manner based on the first temperature data TB1. In the next period PB2, the processing circuit 60 outputs third capacitance control data "1000" and fourth capacitance control data "1001" in a time-division manner based on the second temperature data TB2. Although FIG. 3 illustrates a case where the same capacitance control data is output in the periods PB1 and PB2, the same capacitance control data may not be output in the periods PB1 and PB2.

The processing circuit 60 outputs the capacitance control data CTD at the edge timing of a time-division clock signal CKDV in a time-division manner. The time-division clock signal CKDV may be provided inside the processing circuit 60 or may be input to the processing circuit 60 from outside the processing circuit 60. When the cycle of the time-division clock signal CKDV is PDV, the period PB1 is 8×PDV. Further, 8×PDV corresponds to the sampling cycle of the A/D conversion circuit 50. The period PDV of the time-division clock signal CKDV is not limited to ⅛ of the sampling cycle, and the period PDV may be ½ or less of the sampling cycle.

In the first waveform example CTDa, in the period PB1, the capacitance control data "1000" is output during the period of 6×PDV in total, and the capacitance control data "1001" is output during the period of 2×PDV in total. Considering the average in the period PB1, since the average value of the capacitance control data is 1000.25, the capacitance value of the variable capacitance circuit 31 is 1000.25×C0.

In the second waveform example CTDb, in the period PB1, the capacitance control data "1000" is output during the period of 4×PDV in total, and the capacitance control data "1001" is output during the period of 4×PDV in total. Considering the average in the period PB1, since the average value of the capacitance control data is 1000.5, the capacitance value of the variable capacitance circuit 31 is 1000.5×C0.

In the third waveform example CTDc, in the period PB1, the capacitance control data "1000" is output during the period of 2×PDV in total, and the capacitance control data "1001" is output during the period of 6×PDV in total. Considering the average in the period PB1, the average value of the capacitance control data is 1000.75, so the capacitance value of the variable capacitance circuit 31 is 1000.75×C0.

According to the present embodiment described above, in the period PB1 between the start of the capacitance control based on the first temperature data TB1 and the start of the capacitance control based on the second temperature data, the processing circuit 60 switches the first capacitance control data "1000" corresponding to the first temperature data TB1 and the second capacitance control data "1001" that is different from the first capacitance control data in a time-division manner to be output to the variable capacitance circuit 31.

In this way, the capacitance value of the variable capacitance circuit 31 can be adjusted between the capacitance value indicated by the first capacitance control data and the capacitance value indicated by the second capacitance control data. That is, as described in the first to third waveform examples, when the capacitance value of the variable capacitance circuit 31 can be switched in increments C0, it is possible to set the capacitance value of the variable capacitance circuit 31 in increments smaller than the step C0. As a result, the resolution of capacitance switching can be improved without reducing the capacitance element of the capacitor array that constitutes the variable capacitance circuit 31. Since the resolution of the capacitance switching is improved, the accuracy of temperature compensation is improved, and since it is not necessary to make the capacitance element small, the variation in the capacitance value of the capacitance element does not increase.

In FIG. 3, the second capacitance control data is data obtained by adding "1" to the first capacitance control data, but the present disclosure is not limited thereto, and the capacitance value of the variable capacitance circuit 31 indicated by the second capacitance control data may be different from the capacitance value of the variable capacitance circuit 31 indicated by the first capacitance control data.

Specifically, the second capacitance control data is data that differs from the first capacitance control data by a predetermined value.

In this way, the first capacitance control data and the second capacitance control data are output in a time-division manner in the period PB1 so that capacitance control data having a resolution smaller than a predetermined value is output when viewed as an average value in the period PB1.

More specifically, the first capacitance control data is first integer data. The second capacitance control data is second integer data obtained by adding or subtracting a predetermined value to or from the first integer data.

In this way, the first integer data and the second integer data are output in a time-division manner in the period PB1 so that the capacitance control data between the first integer data and the second integer data is output when viewed as an average value in the period PB1. For example, when the predetermined value is 1, when viewed as an average value in the period PB1, capacitance control data having a decimal resolution smaller than 1 is realized.

2. Detailed Configuration and Processing

Figure 4:
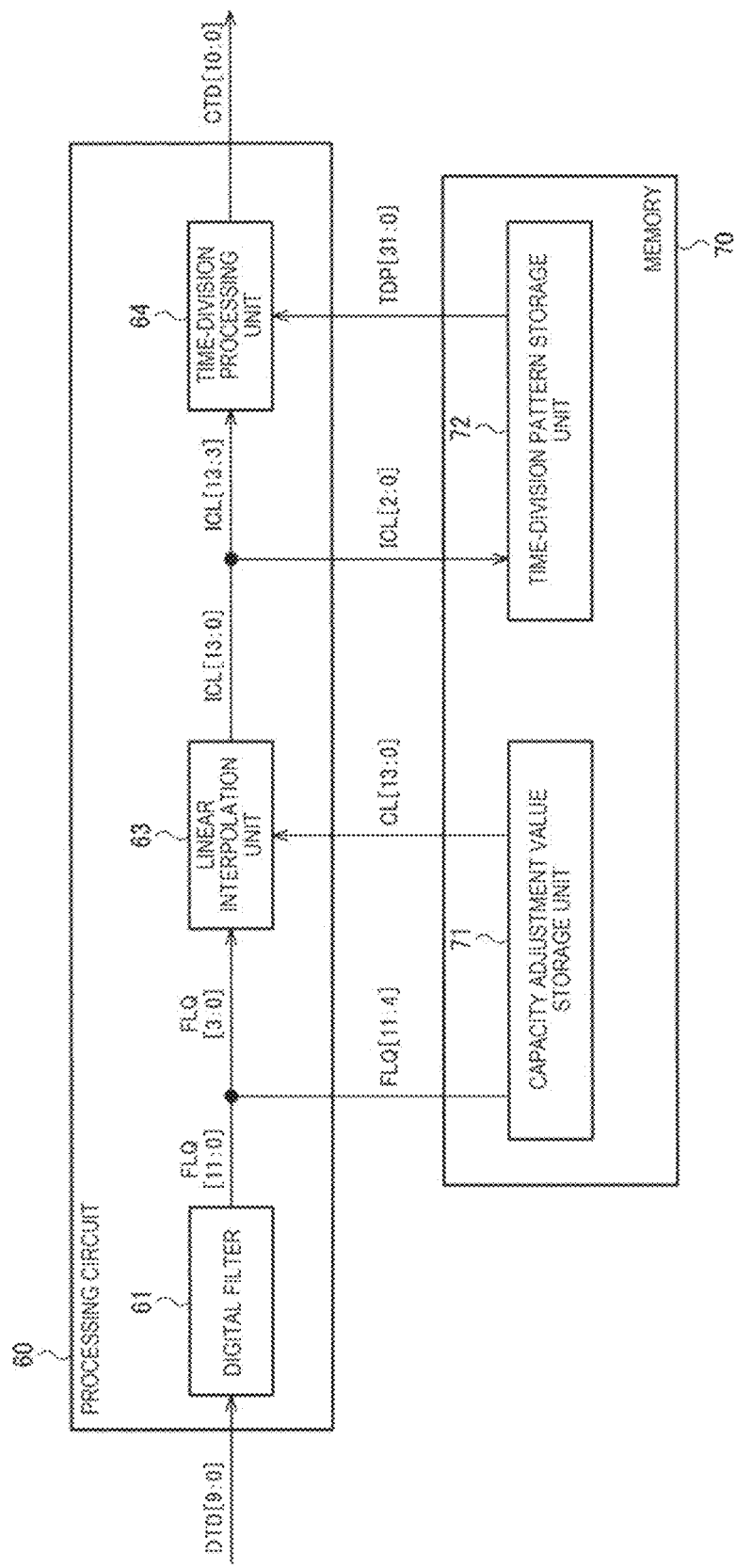
FIG. 4 is a detailed configuration example of a processing circuit and a memory.

FIG. 4 is a detailed configuration example of the processing circuit 60 and the memory 70. The processing circuit 60 includes a digital filter 61, a linear interpolation unit 63, and a time-division processing unit 64. The memory 70 includes a capacitance adjustment value storage unit 71 and a time-division pattern storage unit 72. The number of bits of each data illustrated in FIG. 4 is an example, and the number of bits may be arbitrary.

The processing circuit 60 is a logic circuit including logic elements such as an AND circuit, an OR circuit, an inverter, a latch circuit, and the like. Each of the digital filter 61, the linear interpolation unit 63, and the time-division processing unit 64 may be configured by a separate logic circuit. Alternatively, the processes of the digital filter 61, the linear interpolation unit 63, and the time-division processing unit 64 may be executed by a digital signal processor (DSP). In this case, the DSP executes the programs describing the functions of the digital filter 61, the linear interpolation unit 63, and the time-division processing unit 64 so that the functions of these units are realized.

Figure 5:
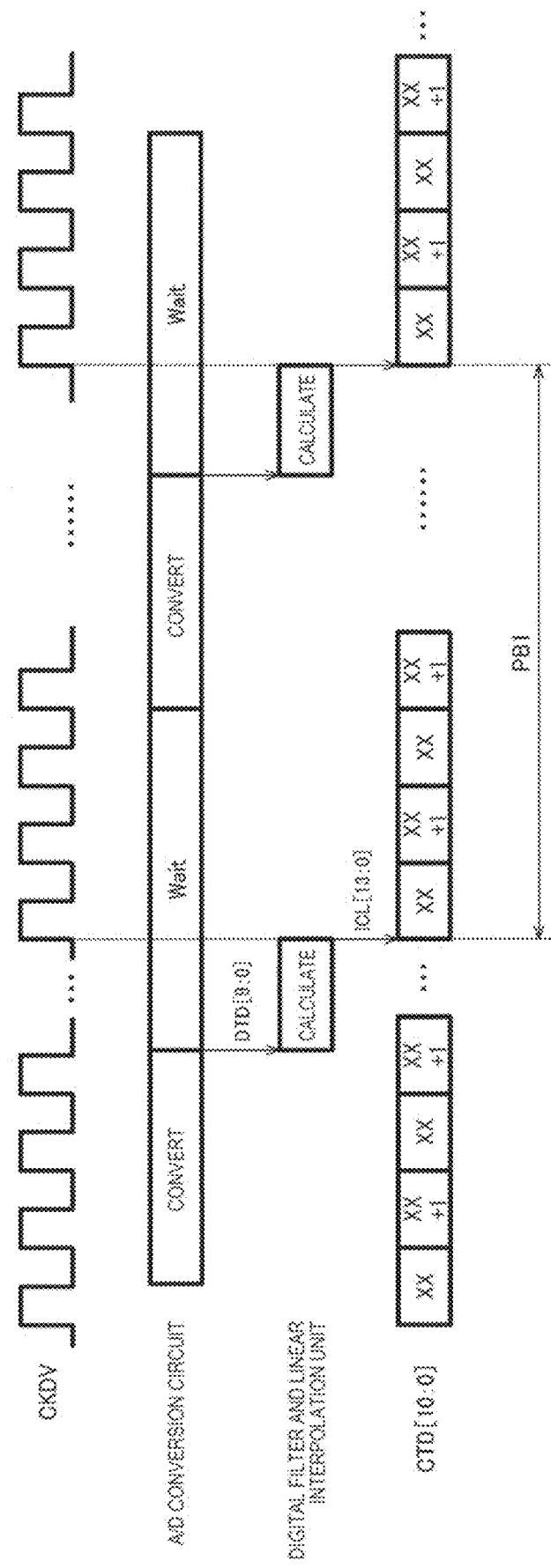
FIG. 5 is a diagram illustrating an operation of an A/D conversion circuit and the processing circuit.

FIG. 5 is a diagram illustrating the operation of the A/D conversion circuit 50 and the processing circuit 60. As illustrated in FIG. 5, the A/D conversion circuit 50 converts the temperature detection voltage VTD into 10-bit temperature data DTD[9:0] and enters a wait state until the next conversion operation is started. The wait period is variably set by, for example, register setting.

The digital filter 61 and the linear interpolation unit 63 perform digital filter processing and interpolation processing based on the temperature data DTD[9:0] and output the result as 14-bit output data ICL[13:0]. For example, the digital filter 61 is an infinite impulse response (IIR) filter, and the digital filter processing is low-pass filter processing. Details of the interpolation processing will be described later.

The time-division processing unit 64 outputs 11-bit capacitance control data CTD[10:0] based on the output data ICL[13:0] of the linear interpolation unit 63. The time-division processing unit 64 outputs first capacitance control data XX and second capacitance control data XX+1 in a time-division manner based on the time-division clock signal CKDV in the period PB1. Here, a case where XX and XX+1 are alternately output for each edge of the time-division clock signal CKDV is illustrated. Further, it is assumed that the period PB1 corresponds to 32 clocks of the time-division clock signal CKDV.

Figure 6:
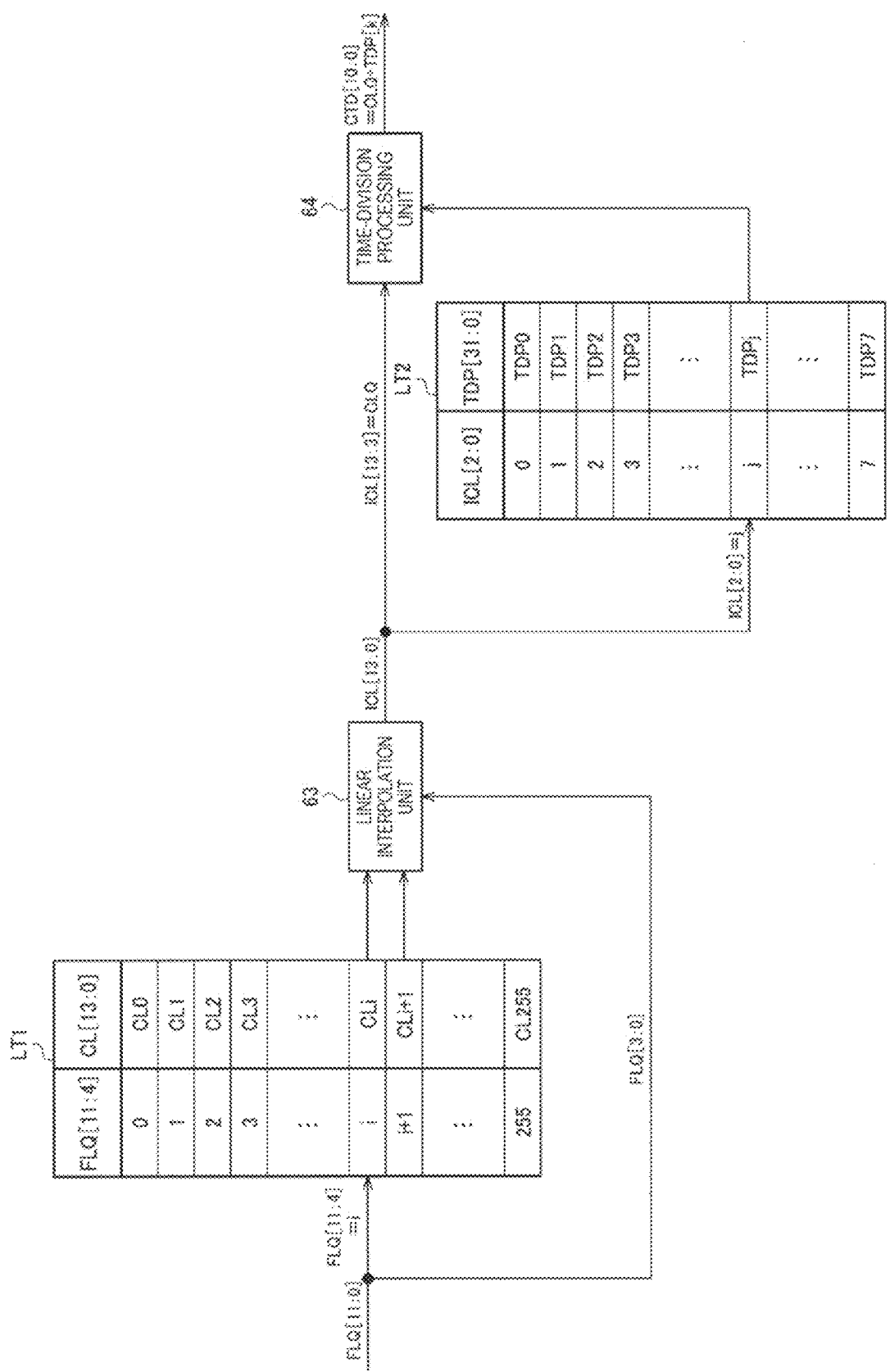
FIG. 6 is a diagram illustrating a detailed operation of the processing circuit and information stored in a memory.

FIG. 6 is a diagram illustrating the detailed operation of the processing circuit 60 and the information stored in the memory 70.

The digital filter 61 performs digital filter processing on the temperature data DTD[9:0] and outputs the result as 12-bit output data FLQ[11:0]. That is, the digital filter 61 smoothes the 10-bit temperature data DTD[9:0] and expands the data to 12 bits. As a result, the noise of the temperature data is reduced and the resolution of the temperature data is expanded by 2 bits, and therefore the accuracy of temperature compensation is improved.

The capacitance adjustment value storage unit 71 stores a first table LT1. The capacitance adjustment value storage unit 71 is a storage area specified by a predetermined address range in the address space in the memory 70. The first table LT1 associates the upper 8-bit FLQ[11:4] of the output data FLQ[11:0] with the 14-bit capacitance adjustment value CL[13:0]. When i is an integer of 0 or more and 255 or less, it is assumed that FLQ[11:4]=i is input to the capacitance adjustment value storage unit 71. The capacitance adjustment value storage unit 71 outputs the capacitance adjustment values CL[13:0]=CLi, CLi+1 corresponding to FLQ[11:4]=i, i+1 in the first table LT1 to the linear interpolation unit 63. CLi is called a first capacitance adjustment value, and CLi+1 is called a second capacitance adjustment value.

The linear interpolation unit 63 performs interpolation processing between the capacitance adjustment values CLi and CLi+1 based on the lower 4-bit FLQ[3:0] of the output data FLQ[11:0] and outputs the result as the capacitance adjustment value ICL[13:0] after the interpolation processing. The capacitance adjustment value ICL[13:0] is a value that controls the capacitance value of the variable capacitance circuit 31 and includes a decimal part realized by time division. The interpolation processing is linear interpolation, and a value corresponding to FLQ[3:0] is selected from values obtained by dividing CLi and CLi+1 into 16 parts.

The time-division pattern storage unit 72 stores a second table LT2. The time-division pattern storage unit 72 is a storage area specified by a predetermined address range in the address space in the memory 70. The second table LT2 associates the lower 3-bit ICL[2:0] of the capacitance adjustment value ICL[13:0] with the 32-bit time-division pattern information TDP[31:0]. ICL[2:0] corresponds to the decimal data of the capacitance adjustment value ICL[13:0] and is data indicating a decimal part realized by time division. When j is an integer of 0 or more and 7 or less, it is assumed that ICL[2:0]=j is input to the time-division pattern storage unit 72. The time-division pattern storage unit 72 outputs the time-division pattern information TDP[31:0]=TDPj corresponding to ICL[2:0]=j in the second table LT2 to the time-division processing unit 64. The time-division pattern information TDP[31:0] is information indicating in what time series the first capacitance control data and the second capacitance control data are output.

The time-division processing unit 64 controls the capacitance control data CTD[10:0] based on the upper 11-bit ICL[13:3] of the capacitance adjustment value ICL[13:0] and the time-division pattern information TDPj in a time-division manner. ICL[13:3] corresponds to integer data of the capacitance adjustment value ICL[13:0] and is data corresponding to the capacitance control data as follows. It is assumed that k is an integer of 0 or more and 31 or less, and ICL[13:3]=CLQ is input to the time-division processing unit 64. At this time, the time-division processing unit 64 outputs CTD[10:0]=CLQ+TDP[k] at the (k+1)th edge of the time-division clock signal CKDV in the period PB1. When TDP[k]=0, CTD[10:0]=CLQ is output, and when TDP[k]=1, CTD[10:0]=CLQ+1 is output.

CLQ is the first capacitance control data, and CLQ+1 is the second capacitance control data. In this way, the first capacitance control data and the second capacitance control data are output in a time-division manner. When CLQ is integer data, CLQ and CLQ+1 are output in a time-division manner to represent a decimal part.

Figure 7:
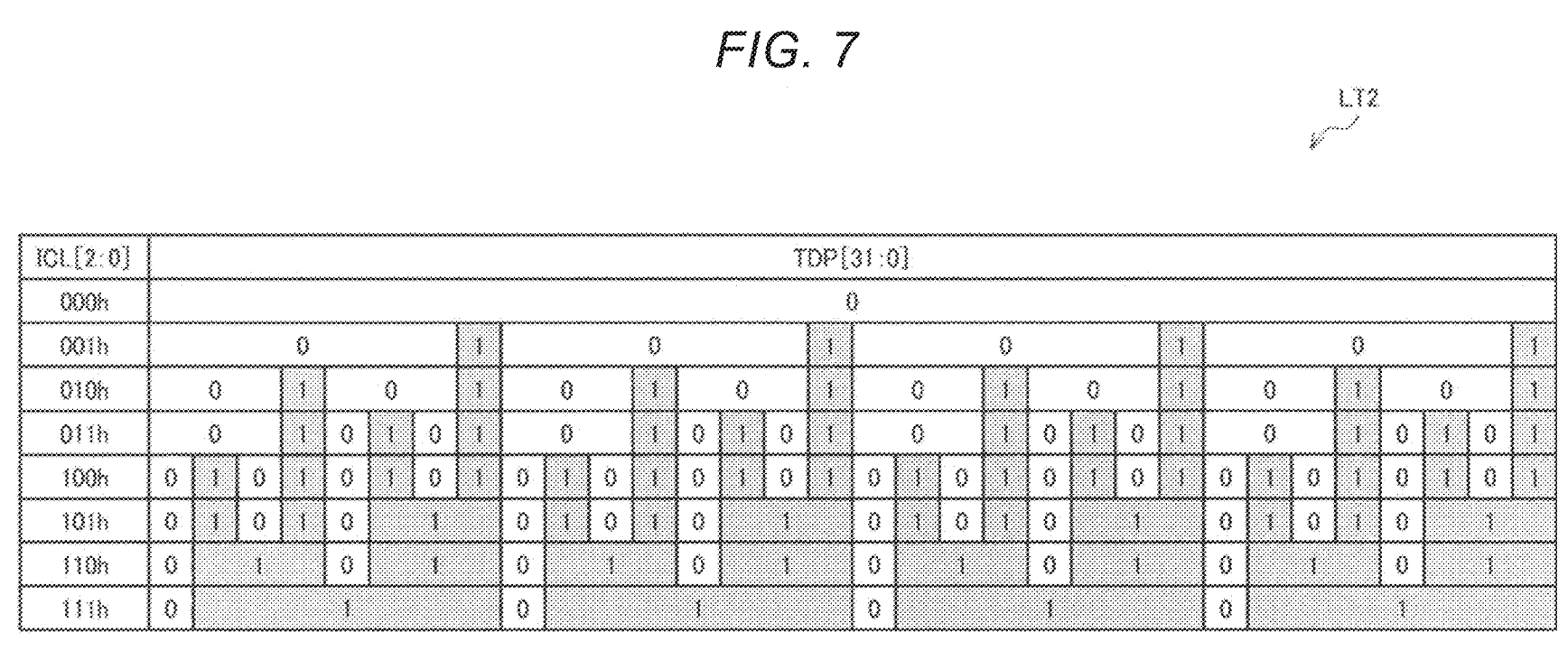

FIG. 7 is an example of the second table LT2. In FIG. 7, the lower 3-bit ICL[2:0] of the capacitance adjustment value are illustrated in binary. In the time-division pattern information TDP[31:0], the logical level of each bit is indicated by 0 or 1.

When ICL[2:0]=000h, the proportion of bits having a logic level of 1 in TDP[31:0] is 0/8, and therefore the corresponding decimal is 0.000.

When ICL[2:0]=001h, the ratio of bits having a logic level of 1 in TDP[31:0] is 1/8, and therefore the corresponding decimal number is 0.125. Similarly, when ICL[2:0]=010h, 011h, 100h, 101h, 110h, 111h, the ratio of bits having a logic level of 1 in TDP[31:0] is 1/8, 1/8, 1/8, 1/8, 1/8, 1/8, and therefore the corresponding decimal is 0.250, 0.375, 0.500, 0.625, 0.750, 0.875.

By performing time-division control using such time-division pattern information TDP[31:0], capacitance control data substantially including a decimal part such as CLQ+0, CLQ+0.125, CLQ+0.250, . . . , CLQ+0.875 is realized.

3. Oscillation Circuit and Variable Capacitance Circuit

Figure 8:
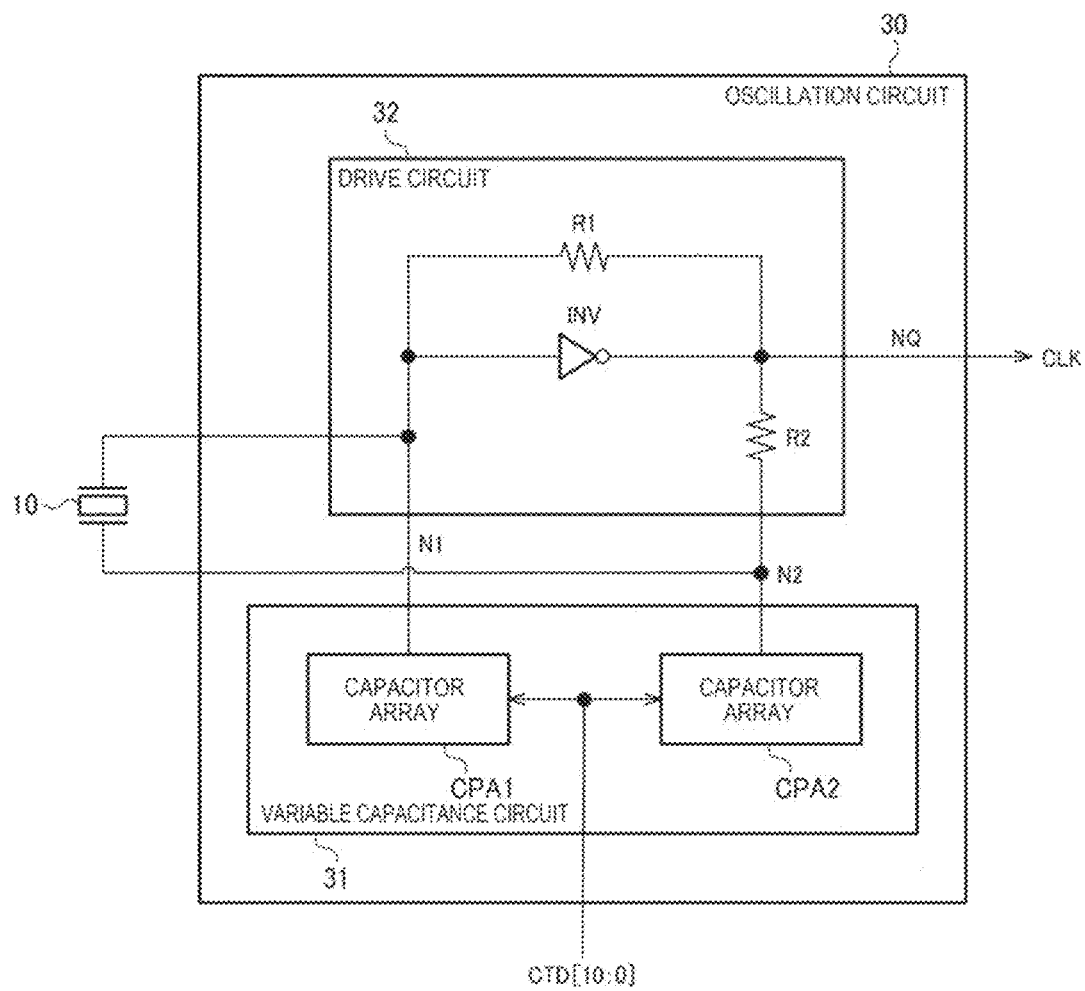
FIG. 8 is a detailed configuration example of an oscillation circuit and the variable capacitance circuit.

FIG. 8 is a detailed configuration example of the oscillation circuit 30 and the variable capacitance circuit 31. The oscillation circuit 30 includes a variable capacitance circuit 31 and a drive circuit 32.

The drive circuit 32 drives the resonator 10 to oscillate the resonator 10 and outputs a clock signal CLK obtained by the oscillation to a node NQ. The node NQ is an output node of the oscillation circuit 30. An input node N1 of the drive circuit 32 is coupled to one end of the resonator 10, and an output node N2 of the drive circuit 32 is coupled to the other end of the resonator 10.

The drive circuit 32 includes an inverter INV and resistors R1 and R2.

The input node of the inverter INV and one end of the resistor R1 are coupled to the input node N1 of the drive circuit 32. The output node of the inverter INV and the other end of the resistor R1 are coupled to the node NQ. One end of the resistor R2 is coupled to the node NQ, and the other end of the resistor R2 is coupled to the output node N2 of the drive circuit 32.

The variable capacitance circuit 31 is coupled to the input node N1 and the output node N2 of the drive circuit 32. The change in the capacitance value of the variable capacitance circuit 31 based on the capacitance control data CTD[10:0] changes the load of the drive circuit 32 and the oscillation frequency of the oscillation circuit 30. Thereby, temperature compensation of the oscillation frequency is realized. The variable capacitance circuit 31 includes a capacitor array CPA1 coupled to the input node N1 of the drive circuit 32 and a capacitor array CPA2 coupled to the output node N2 of the drive circuit 32. The capacitor arrays CPA1 and CPA2 are set to the same capacitance value by the capacitance control data CTD[10:0]. Only one of the capacitor arrays CPA1 and CPA2 may be provided.

Figure 9:
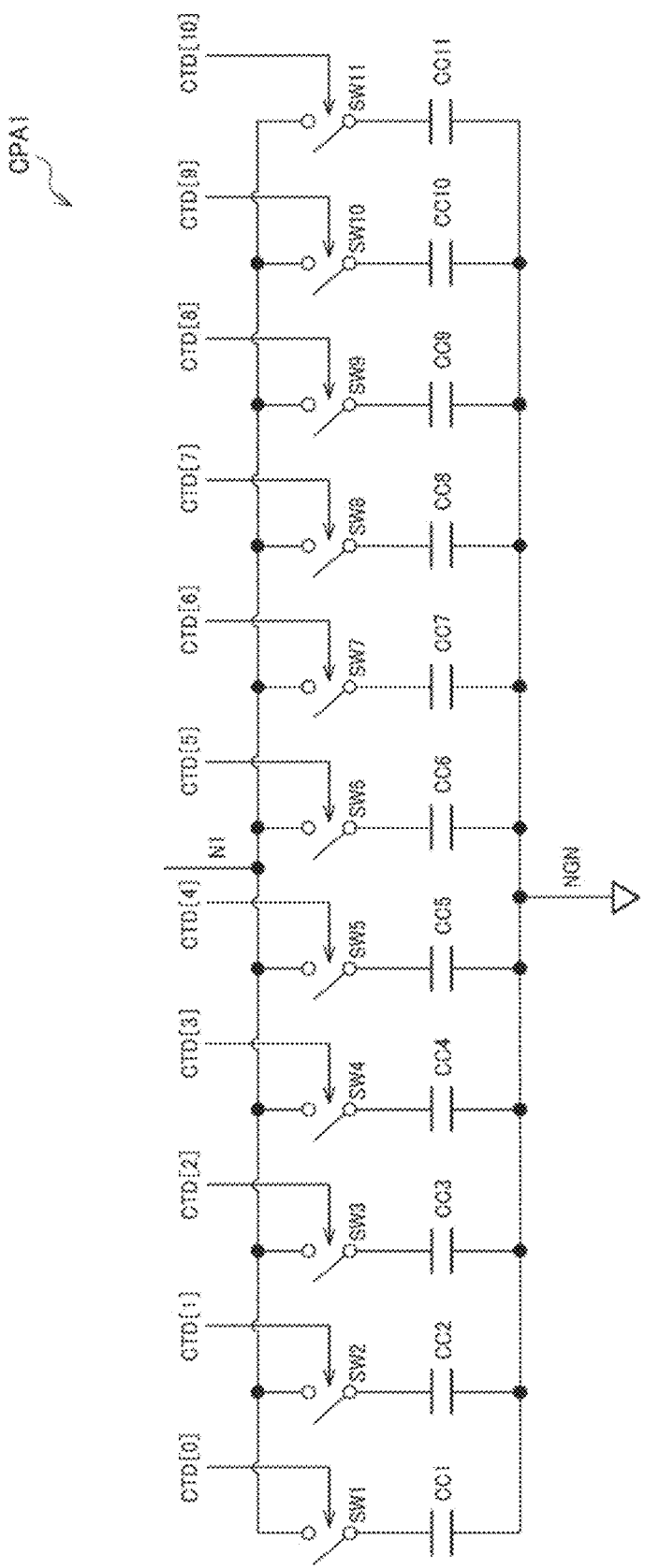
FIG. 9 is a first configuration example of a capacitor array.

FIG. 9 illustrates a first configuration example of the capacitor array CPA1. Since the capacitor array CPA2 has the same configuration, the capacitor array CPA1 will be described here as an example.

The capacitor array CPA1 includes capacitors CC1 to CC11 and switches SW1 to SW11. The number of capacitors and switches is not limited thereto, and the capacitor array CPA1 may include the first to n-th capacitors and the first to n-th switches. n is an integer of 2 or more.

One end of the switch SW1 is coupled to one end of the capacitor CC1. Similarly, one ends of the switches SW2 to SW11 are coupled to the other ends of the capacitors CC2 to CC11, respectively. The other ends of the switches SW1 to SW11 are coupled to the input node N1 of the drive circuit 32. The switches SW1 to SW11 are, for example, transistors. The switch SW1 is controlled to be turned on or off by the first bit CTD[0] of the capacitance control data CTD[10:0]. Similarly, the switches SW2 to SW11 are turned on or off by the second to eleventh bit CTD[1] to CTD[11] of the capacitance control data CTD[10:0], respectively.

The capacitors CC1 to CC11 are weighted in binary.

That is, when s is an integer of 1 or more and 11 or less, the capacitance value of the capacitor CCs is $2^{s-1}$ times the capacitance value of the capacitor CC1. The capacitance value of the capacitor CC1 corresponds to the above-described minimum increments C0. The other ends of the capacitors CC1 to CC11 are coupled to a ground node NGN.

Figure 10:
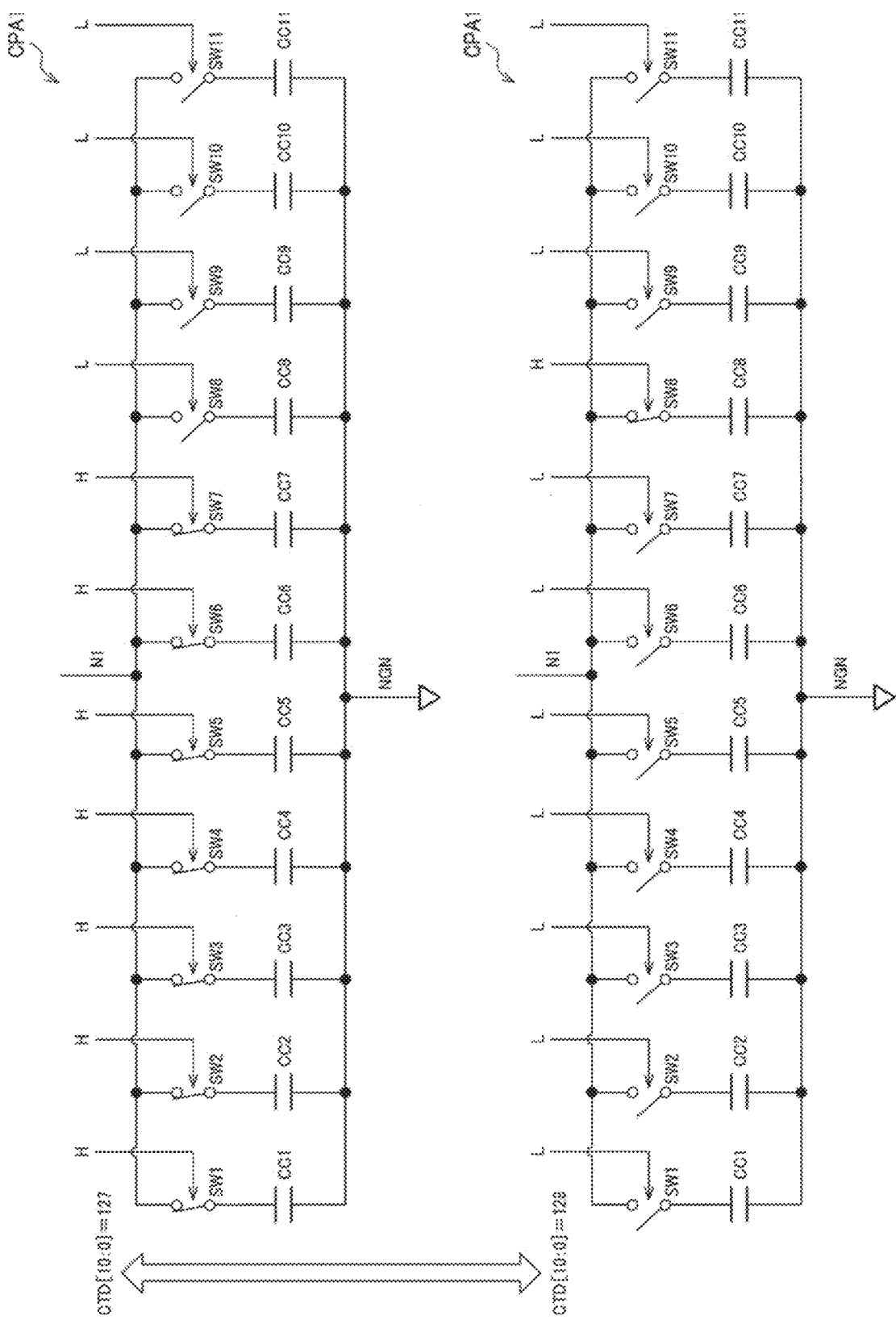
FIG. 10 is a diagram illustrating an operation of a first configuration example of the capacitor array.

FIG. 10 is a diagram illustrating the operation of the first configuration example of the capacitor array CPA1. Here, a case where CLQ=127 in FIG. 6 will be described as an example. That is, the first capacitance control data is CTD[10:0]=CLQ=127, and the second capacitance control data is CTD[10:0]=CLQ+1=128.

When CTD[10:0]=127, the switches SW1 to SW7 are turned on and the switches SW8 to SW11 are turned off.

Therefore, the capacitors CC1 to CC7 are coupled to the input node N1 of the drive circuit 32, and the capacitance value of the capacitor array CPA1 becomes 127×C0.

When CTD[10:0]=128, the switches SW1 to SW7 are turned off, the switch SW8 is turned on, and the switches SW9 to SW11 are turned off. Therefore, the capacitor CC8 is coupled to the input node N1 of the drive circuit 32, and the capacitance value of the capacitor array CPA1 is 128×C0.

By switching the capacitance value of the capacitor array CPA1 to 127×C0 and 128×C0 in a time-division manner, a capacitance value between 127×C0 and 128×C0 is realized as an average value.

Figure 11:
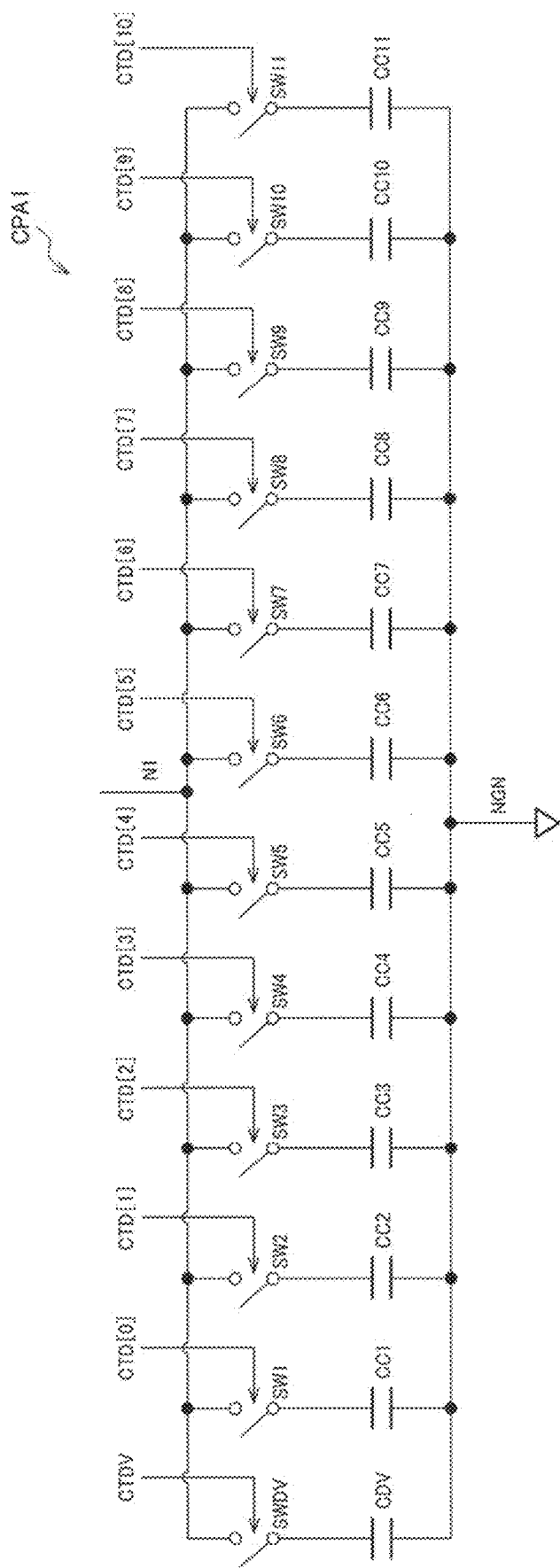
FIG. 11 is a second configuration example of the capacitor array.

FIG. 11 illustrates a second configuration example of the capacitor array CPA1. Since the capacitor array CPA2 has the same configuration, the capacitor array CPA1 will be described here as an example.

The capacitor array CPA1 includes capacitors CC1 to CC11, a switching capacitor CDV, switches SW1 to SW11, and a switching switch SWDV. The number of capacitors and switches is not limited thereto, and the capacitor array CPA1 may include the first to n-th capacitors, a switching capacitor, the first to n-th switches, and a switching switch.

The capacitors CC1 to CC11 and the switches SW1 to SW11 are the same as in the first configuration example. One end of the switching switch SWDV is coupled to the input node N1 of the drive circuit 32. The other end of the switching switch SWDV is coupled to one end of the switching capacitor CDV. The switching switch SWDV is, for example, a transistor. The other end of the switching capacitor CDV is coupled to the ground node NGN. The capacitance value of the switching capacitor CDV is the same as the capacitance value of the capacitor CC1. That is, the capacitance value of the switching capacitor CDV corresponds to the minimum increments C0.

Figure 12:
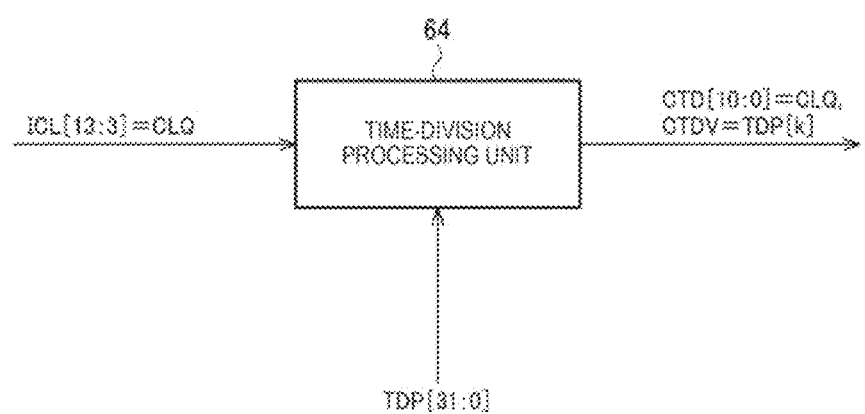
FIG. 12 is a diagram illustrating an operation of a time-division processing unit when the capacitor array is the second configuration example.

FIG. 12 is a diagram illustrating the operation of the time-division processing unit 64 when the capacitor array CPA1 has the above-described second configuration example.

The time-division processing unit 64 outputs CTD[10:0]=CLQ and CTDV=TDP[k] based on the upper 11-bit ICL[13:0]=CLQ of the capacitance adjustment value ICL[13:0] and the time-division pattern information TDP[31:0]. In this case, CTD[10:0]=CLQ and CTDV=TDP[k] are capacitance control data. In time-division control, CTD[10:0]=CLQ does not change, and CTDV=TDP[k] switches to 0 or 1. CTD[10:0]=CLQ and CTDV=0 correspond to the first capacitance control data, and CTD[10:0]=CLQ and CTDV=1 correspond to the second capacitance control data.

Figure 13:
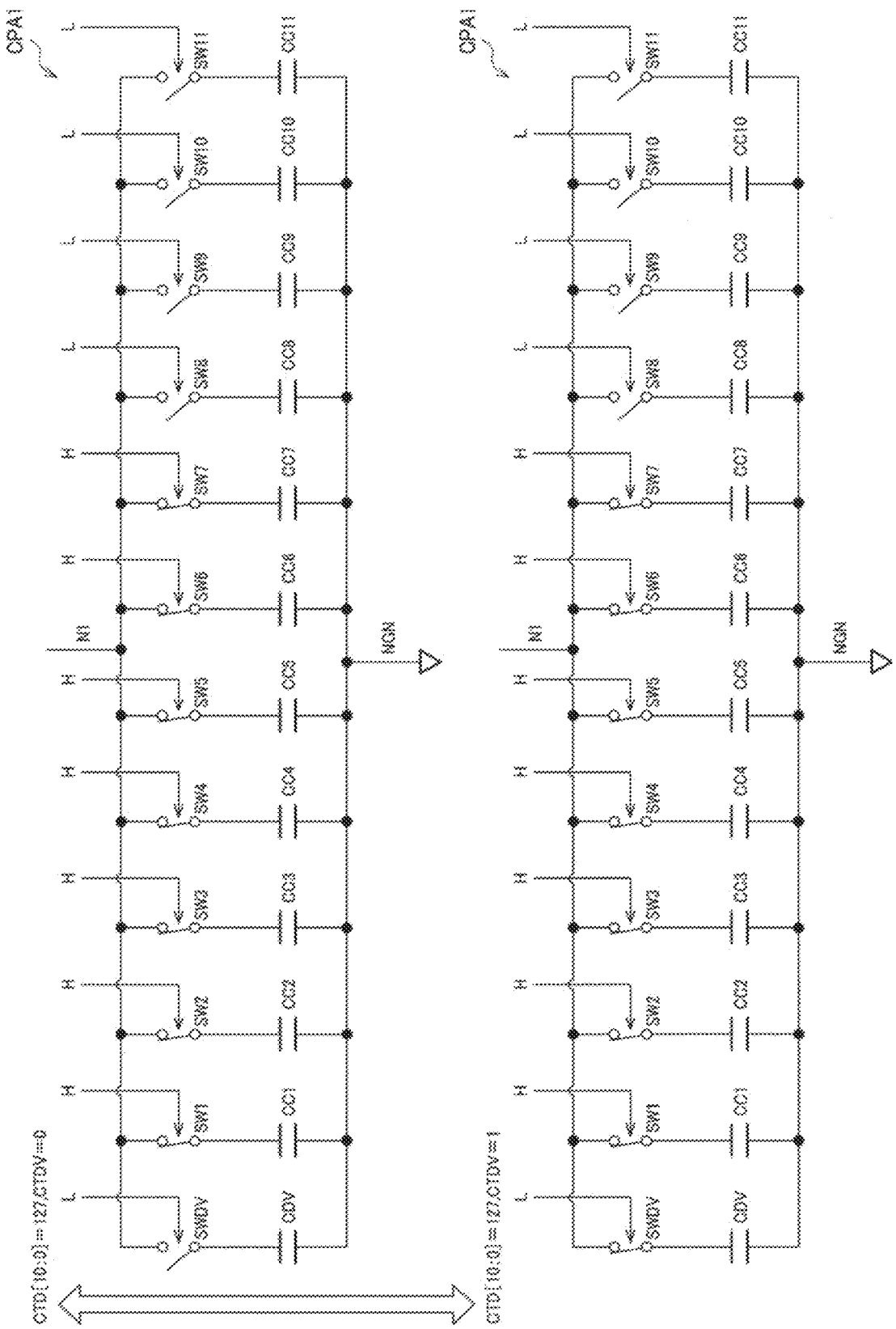
FIG. 13 is a diagram illustrating an operation of the second configuration example of the capacitor array.

FIG. 13 is a diagram illustrating the operation of the second configuration example of the capacitor array CPA1. Here, a case where CLQ=127 in FIG. 6 will be described as an example. That is, the first capacitance control data is CTD[10:0]=CLQ=127, CTDV=0, and the second capacitance control data is CTD[10:0]=CLQ=127, CTDV=1.

Since CTD[10:0]=127 in both the first capacitance control data and the second capacitance control data, the switches SW1 to SW7 are turned on and the switches SW8 to SW11 are turned off. That is, the on/off states of the switches SW1 to SW11 do not change in the time-division control.

When CTDV=0, the switching switch SWDV is turned off. Therefore, the capacitors CC1 to CC7 are coupled to the input node N1 of the drive circuit 32, and the capacitance value of the capacitor array CPA1 becomes 127×C0.

When CTDV=1, the switching switch SWDV is turned on. Therefore, the capacitors CC1 to CC7 and the switching capacitor CDV are coupled to the input node N1 of the drive circuit 32, and the capacitance value of the capacitor array CPA1 is 128×C0.

By switching the capacitance value of the capacitor array CPA1 to 127×C0 and 128×C0 in a time-division manner, the average capacitance value between 127×C0 and 128×C0 is realized.

Further, the capacitance value of the capacitor array CPA1 with respect to CTD[10:0] is considered to have non-linearity. However, in this configuration example, since CTD[10:0] does not change in the time-division control, the time-division control is not affected by the non-linearity. For example, time-division control for switching between two values having a large differential non-linearity (DNL) does not occur.

Further, for example, when the switch SW8 is switched from off to on, the capacitor CC8 is coupled to the input node N1 of the drive circuit 32, and therefore the capacitor CC8 is charged. In the time-division control, the switches are switched in a cycle earlier than the temperature data sampling cycle, and thus the larger the capacitance value of the coupled capacitor, the more the charge may not be in time. If the charge is not in time, the capacitance value of the capacitor array CPA1 may be inaccurate. However, in this configuration example, on/off of the switches SW1 to SW11 is not switched in time-division control, and only the switching switch SWDV is switched on or off. Since the capacitance value of the switching capacitor CDV is small, the above charging problem is unlikely to occur and the capacitance value of the capacitor array CPA1 becomes accurate.

In FIG. 13, when the first capacitance control data is input to the capacitor array CPA1, the switching switch SWDV is turned off, and when the second capacitance control data is input to the capacitor array CPA1, the switching switch SWDV is turned on, but is not limited thereto. That is, when the first capacitance control data is input to the capacitor array CPA1, the switching switch SWDV may be turned to one of on or off, and when the second capacitance control data is input to the capacitor array CPA1, the switching switch SWDV may be turned to the other of on or off.

4. Real-Time Clock Device

Figure 14:
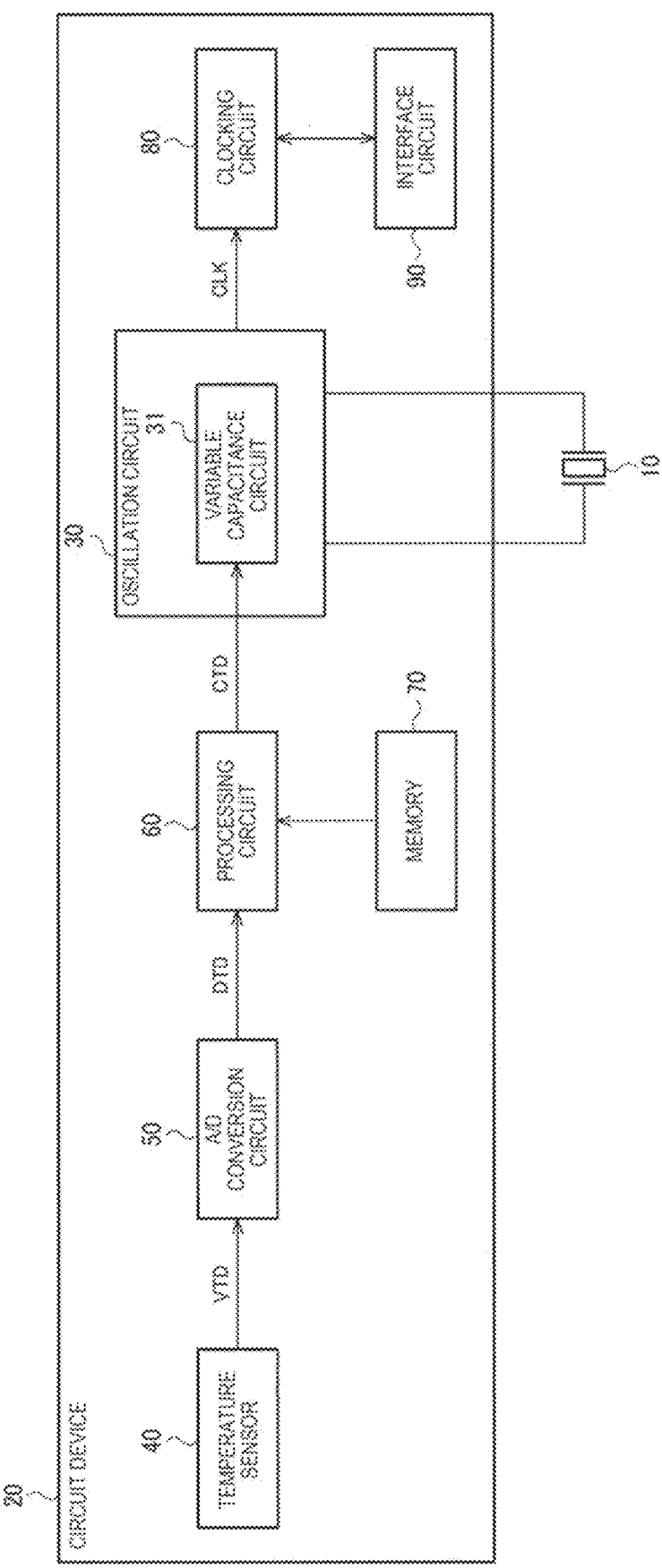
FIG. 14 is a configuration example of the circuit device and the oscillator when the oscillator is a real-time clock device.

FIG. 14 is a configuration example of the circuit device 20 and the oscillator 4 when the oscillator 4 is a real-time clock device. The oscillator 4, which is a real-time clock device, includes a resonator 10 and a circuit device 20. The circuit device 20 includes an oscillation circuit 30, a temperature sensor 40, an A/D conversion circuit 50, a processing circuit 60, a memory 70, a clocking circuit 80, and an interface circuit 90. The components already described in FIG. 1 and the like are denoted by the same reference numerals, and the description of the components will be appropriately omitted.

The clocking circuit 80 generates time information based on the clock signal CLK output by the oscillation circuit 30. The time information is information indicating the current time, and includes, for example, seconds, minutes, hours, days, months, and years. The clocking circuit 80 includes a frequency dividing circuit and a counter. The frequency dividing circuit divides the clock signal CLK to output a clock signal having a cycle of seconds. The counter generates time information by counting the number of clocks of a clock signal having a cycle of seconds.

The interface circuit 90 communicates with an external processing device of the oscillator 4. The external processing device transmits a read command for reading the time information to the interface circuit 90. When the interface circuit 90 receives a read command, the time information is read from the clocking circuit 80 and the read time information is transmitted to the external processing device. For example, the interface circuit 90 is a serial interface circuit of serial peripheral interface (SPI) system or inter integrated circuit (I2C) system.

As described above, the circuit device 20 of the present embodiment can highly accurately temperature compensate the oscillation frequency of the oscillation circuit 30. That is, the circuit device 20 can keep the frequency deviation of the oscillation frequency small with respect to the temperature fluctuation. By applying such a circuit device 20 to a real-time clock device, the real-time clock device can perform timekeeping with a highly accurate clock signal with a small frequency deviation and can generate highly accurate time information.

5. Electronic Device and Vehicle

Figure 15:
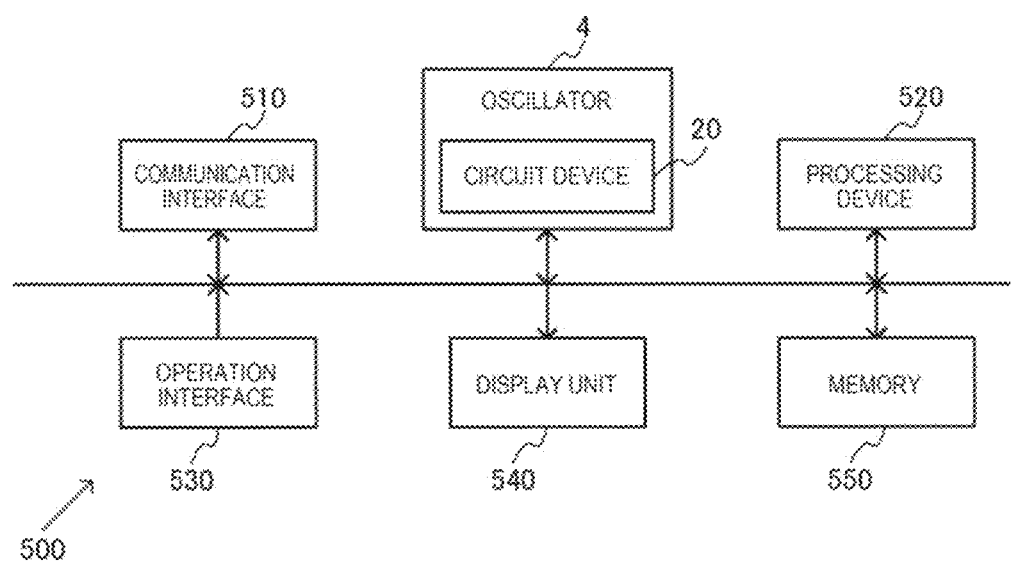
FIG. 15 is a configuration example of an electronic device.

FIG. 15 illustrates a configuration example of an electronic device 500 including the circuit device 20 of the present embodiment. The electronic device 500 includes the circuit device 20 and a processing device 520 that operates based on an output signal from the circuit device 20. Specifically, the electronic device 500 includes the oscillator 4, and the oscillator 4 includes the circuit device 20. For example, the processing device 520 operates based on the clock signal from the oscillator 4 or time information. The electronic device 500 may include a communication interface 510, an operation interface 530, a display unit 540, and a memory 550. The electronic device 500 is not limited to the configuration of FIG. 15, and various modifications such as omission of some of these components and addition of other components are possible.

The electronic device 500 is, for example, a network-related device such as a base station or a router, a highly accurate measuring device that measures a physical quantity such as a distance, a time, a flow velocity or a flow rate, a biological information measuring device that measures biological information, or an in-vehicle device. The biological information measuring device is, for example, an ultrasonic measuring device, a pulse wave meter, a blood pressure measuring device, or the like. The in-vehicle device is an electronic control unit (ECU) that electronically controls a vehicle, a device for automatic driving, or the like. Also, the electronic device 500 is a wearable device such as a head-mounted display device or a clock-related device, a robot, a printing device, a projection device, a portable information terminal such as a smartphone, a content providing device for distributing content, or a video device such as a digital camera or a video camera.

The communication interface 510 performs processing for receiving data from the outside and transmitting data to the outside. The communication interface 510 may be either a wireless communication interface or a wired communication interface. The processing device 520, which is a processor, performs control processing of the electronic device 500, various digital processing of data transmitted and received via the communication interface 510, and the like. The function of the processing device 520 can be realized by a processor such as a microcomputer, for example. The operation interface 530 is for a user to perform an input operation, and can be realized by operation buttons, a touch panel display, or the like. The display unit 540 displays various information and can be realized by a display such as a liquid crystal display or an organic EL display. The memory 550 stores data, and the function thereof can be realized by a semiconductor memory such as a RAM or a ROM.

Figure 16:
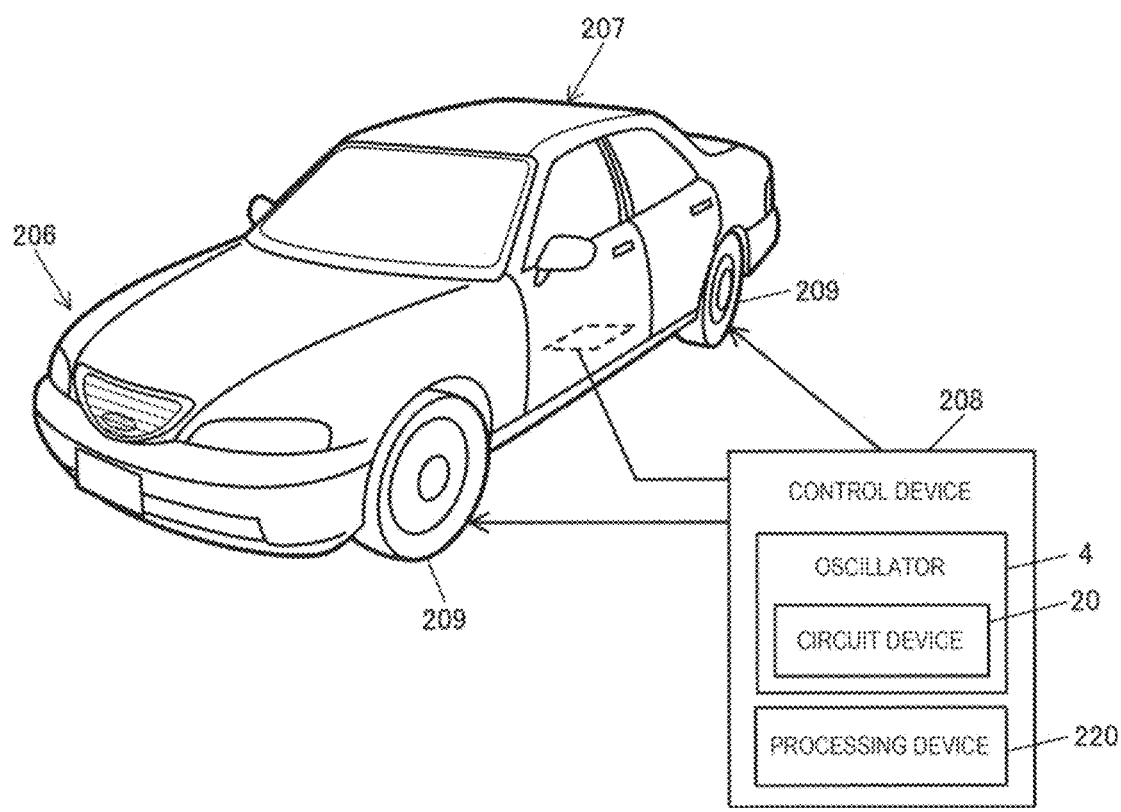
FIG. 16 is an example of a vehicle.

FIG. 16 illustrates an example of a vehicle including the circuit device 20 of the present embodiment. The moving body includes the circuit device 20 of the present embodiment and a processing device 220 that operates based on an output signal from the circuit device 20. Specifically, the vehicle includes the oscillator 4, and the oscillator 4 includes the circuit device 20. For example, the processing device 220 operates based on the clock signal from the oscillator 4 or the time information. The circuit device 20 of the present embodiment can be incorporated in various vehicles such as a car, an airplane, a motorcycle, a bicycle, or a ship. The vehicle is a device or an apparatus that moves on the ground, in the sky or on the sea including a driving mechanism such as an engine, a motor, or the like, a steering mechanism such as a steering wheel, a rudder, or the like, and various electronic devices.

FIG. 16 schematically illustrates an automobile 206 as a specific example of a vehicle. The circuit device of the present embodiment is incorporated in the automobile 206. Specifically, the automobile 206 that is a vehicle includes a control device 208, and the control device 208 includes the oscillator 4 including the circuit device 20 of the present embodiment and a processing device 220 that operates based on a clock signal generated by the oscillator 4. The control device 208 controls the hardness of the suspension and controls the brakes of individual wheels 209 according to the posture of a vehicle body 207, for example. For example, the control device 208 may realize automatic driving of the automobile 206. The device in which the circuit device 20 of the present embodiment is incorporated is not limited to such a control device 208, and the circuit device 20 may be incorporated in various vehicle-mounted devices such as a meter panel device and a navigation device provided in a vehicle such as an automobile 206.

The circuit device of the present embodiment described above includes an oscillation circuit and a processing circuit. The oscillation circuit includes a variable capacitance circuit configured by a capacitor array and oscillates at an oscillation frequency corresponding to the capacitance value of the variable capacitance circuit. Temperature data obtained by A/D converting the temperature detection voltage from the temperature sensor is input to the processing circuit. The processing circuit controls the capacitance of the variable capacitance circuit based on the temperature data. First temperature data and second temperature data subsequent to the first temperature data are input to the processing circuit as temperature data. In the period between the start of the capacitance control based on the first temperature data and the start of the capacitance control based on the second temperature data, the processing circuit switches the first capacitance control data corresponding to the first temperature data and the second capacitance control data different from the first capacitance control data in a time-division manner to be output to the variable capacitance circuit.

In this way, when the capacitance value of the variable capacitance circuit that is controlled in a time-division manner is viewed as a time average, a capacitance value between the capacitance value indicated by the first capacitance control data and the capacitance value indicated by the second capacitance control data is realized. That is, when the capacitance value of the variable capacitance circuit can be switched in increments C0, a capacitance value in increments smaller than the increments C0 is realized. As a result, the resolution of capacitance adjustment is improved, and the oscillation frequency can be temperature-compensated with high accuracy. Further, the resolution of capacitance adjustment can be improved without reducing the capacitance element of the capacitor array that constitutes the variable capacitance circuit.

Further, in the present embodiment, the second capacitance control data may be data different from the first capacitance control data by a predetermined value.

In this way, the first capacitance control data and the second capacitance control data are output in a time-division manner so that capacitance control data having a resolution smaller than a predetermined value is output when viewed as a time average value.

Further, in the present embodiment, the first capacitance control data may be the first integer data. The second capacitance control data may be second integer data obtained by adding or subtracting a predetermined value to or from the first integer data.

In this way, the first integer data and the second integer data are output in a time-division manner so that the capacitance control data between the first integer data and the second integer data is output when viewed as a time average value. For example, when the predetermined value is 1, when viewed as a time average value, capacitance control data with a decimal resolution smaller than 1 is realized.

With this decimal resolution, a capacitance value smaller than the above-described increments C0 is realized.

Further, in the present embodiment, the circuit device may include a memory that stores time-division pattern information. The processing circuit may switch the first capacitance control data and the second capacitance control data in a time-division manner based on the time-division pattern information read from the memory to be output to the variable capacitance circuit.

In this way, the processing circuit can switch the first capacitance control data and the second capacitance control data in a time-division manner based on the time-division pattern information read from the memory to be output in time series indicated by the time-division pattern information.

Further, in the present embodiment, the memory may store the temperature data and the capacitance adjustment value of the variable capacitance circuit in association with each other, and may store the decimal data of the capacitance adjustment value and the time-division pattern information in association with each other. The processing circuit may read the capacitance adjustment value corresponding to the temperature data from the memory, and may read the time-division pattern information corresponding to the decimal data of the read capacitance adjustment value from the memory.

The processing circuit may switch the first capacitance control data based on the capacitance adjustment value read from the memory, and the second capacitance control data that is integer data obtained by adding or subtracting a predetermined value to or from the first capacitance control data in a time-division manner based on the time-division pattern information read from the memory to be output to the variable capacitance circuit.

In this way, the capacitance adjustment value indicating the capacitance value of the variable capacitance circuit includes integer data and decimal data. Then, the first capacitance control data and the second capacitance control data are determined by the integer data, the time-division pattern information is determined by the decimal data, and the first capacitance control data and the second capacitance control data are output in a time-division manner based on the time-division pattern information. In this way, time-division control is realized.

Further, in the present embodiment, the circuit device may include a memory that stores the temperature data and the capacitance adjustment value of the variable capacitance circuit in association with each other. The processing circuit may obtain a capacitance adjustment value corresponding to the temperature data by reading the first capacitance adjustment value and the second capacitance adjustment value corresponding to the upper bits of the temperature data and linearly interpolating the first capacitance adjustment value and the second capacitance adjustment value based on the lower bits of the temperature data. The processing circuit may switch the first capacitance control data that is integer data of the capacitance adjustment value and the second capacitance control data in a time-division manner based on the decimal data of the capacitance adjustment value to be output to the variable capacitance circuit.

In this way, the memory stores the table in which the temperature data and the capacitance adjustment value are associated with each other. By linearly interpolating the capacitance adjustment value, a capacitance adjustment value having a higher temperature resolution than the temperature step in the table is generated. Thereby, the oscillation frequency can be temperature-compensated with high accuracy. In addition, since the data amount of the table can be saved, the storage capacitance of the memory can be saved.

Further, in the present embodiment, the processing circuit may include a digital filter that performs digital filter processing on the temperature data. The processing circuit may control the capacitance value of the variable capacitance circuit based on the temperature data after the digital filter processing.

In this way, digital filter processing such as noise reduction of temperature data becomes possible. As a result, the processing circuit can control the capacitance based on the high-quality temperature data after the digital filter processing, and thus the accuracy of temperature compensation can be improved.

Further, in the present embodiment, the capacitor array may include binary weighted first to n-th capacitors, first to n-th switches, a switching capacitor, and a switching switch. One end of each of the first to n-th switches may be coupled to one end of each of the first to n-th capacitors, and the other end may be coupled to an output node or an input node of the drive circuit of the oscillation circuit. One end of the switching switch may be coupled to one end of the switching capacitor, and the other end may be coupled to an output node or an input node of the drive circuit. The on/off states of the first to n-th switches may not change between when the first capacitance control data is input and when the second capacitance control data is input. The switching switch may be turned to one of on or off when the first capacitance control data is input, and may be turned to the other of on or off when the second capacitance control data is input.

In this way, since the first to n-th switches are not switched in the time-division control, the connection relationship between the first to n-th capacitors and the output node or input node of the drive circuit does not change. Thus, the time-division control is not affected by the non-linearity of the capacitance value of the variable capacitance circuit. For example, time-division control for switching between two capacitance values having a large DNL does not occur.

The oscillator of the present embodiment includes the circuit device according to any one of the above and a resonator. The resonator is electrically coupled to the oscillation circuit and oscillates by the oscillation circuit.

The real-time clock device of the present embodiment also includes a temperature sensor, an A/D conversion circuit, an oscillation circuit, a memory, a processing circuit, and a clocking circuit. The temperature sensor generates a temperature detection voltage. The A/D conversion circuit generates temperature data by A/D converting the temperature detection voltage. The oscillation circuit includes a variable capacitance circuit configured by a capacitor array and oscillates at an oscillation frequency corresponding to the capacitance value of the variable capacitance circuit. The memory stores the capacitance adjustment value corresponding to the temperature data. The processing circuit controls the capacitance value of the variable capacitance circuit based on the temperature data and the capacitance adjustment value. The clocking circuit generates time information based on the clock signal output by the oscillation circuit. The capacitor array includes a plurality of capacitors and a switching switch coupled to one of the plurality of capacitors. The processing circuit controls the capacitance value of the variable capacitance circuit with a resolution smaller than the minimum capacitance value of the plurality of capacitors by controlling the switching switch in a time-division manner.

The real-time clock device of the present embodiment improves the resolution of capacitance adjustment by controlling the capacitance value in a time-division manner, and thus the oscillation frequency can be temperature compensated with high accuracy. That is, the real-time clock device according to the present embodiment can keep the frequency deviation of the oscillation frequency small with respect to the temperature fluctuation. As a result, the real-time clock device according to the present embodiment can measure time with a highly accurate clock signal with a small frequency deviation and can generate highly accurate time information.

Further, in the present embodiment, the processing circuit may be configured to perform digital filter processing on the temperature data. The processing circuit may be configured to obtain the capacitance adjustment value corresponding to the digitally filtered temperature data by performing interpolation processing on the capacitance adjustment value stored in the memory.

In this way, the processing circuit can control the capacitance based on the high-quality temperature data after the digital filter processing, and thus the accuracy of temperature compensation can be improved. By improving the accuracy of temperature compensation, the real-time clock device of the present embodiment can generate more accurate time information.

Further, in the present embodiment, the memory may store time-division pattern information corresponding to the lower bits of the capacitance adjustment value obtained by the interpolation processing. The processing circuit may control the switching switch based on the time-division pattern information.

In this way, the processing circuit can switch on/off of the switching switch in a time-division manner based on the time-division pattern information read from the memory in a time series indicated by the time-division pattern information.

In the present embodiment, the plurality of capacitors may include the first, second, ..., n-th capacitors (n is an integer of 2 or more), the first to n-th switches, and a switching capacitor. The capacitance values of the first, second, ..., n-th capacitors may be $C0, 2 \times C0, \ldots, 2^{n-1} \times C0$. The first to n-th switches may be coupled in series to the first to n-th capacitors, respectively. The capacitance value of the switching capacitor may be $C0$. The switching switch may be coupled in series with the switching capacitor. The switching switch may be controlled to be turned on and off in a shorter cycle than the first to n-th switches.

In this way, the above-described time-division control is realized by the on/off control of the switching switches in a shorter cycle than the first to n-th switches. That is, the switching switch is controlled in a time-division manner to be turned on and off during the period between the timing at which the on/off states of the first to n-th switches are switched and the timing at which the on/off states of the first to n-th switches are switched next. The capacitance value of the capacitor array includes the capacitance value of the switching capacitor when the switching switch is on, and does not include the capacitance value of the switching capacitor when the switching switch is off. As a result, the capacitance value of the variable capacitance circuit is time-division controlled.

The electronic device of the present embodiment includes the circuit device according to any one of the above, and a processing device that operates based on an output signal from the circuit device.

The vehicle of the present embodiment includes the circuit device described in any of the above, and a processing device that operates based on an output signal from the circuit device.

Although the embodiment has been described in detail as above, but those skilled in the art will easily understand that many modifications may be made without deviating practically from the new matters and effects of the present disclosure. Therefore, such modifications are all included in the scope of the present disclosure. For example, in the specification or the drawings, terms described with broader or equivalent different terms at least once may be replaced with different terms at any point in the description or drawings. In addition, all combinations of the embodiment and modification examples are included in the scope of the present disclosure. The configurations and operations of the circuit device, the resonator, the oscillator, the real-time clock device, the electronic device, and the vehicle are not limited to those described in the present embodiment, and various modifications can be made.

What is claimed is:

1. A circuit device comprising:
   an oscillation circuit that includes a variable capacitance circuit configured by a capacitor array and oscillates at an oscillation frequency corresponding to a capacitance value of the variable capacitance circuit; and
   a processing circuit to which temperature data obtained by A/D converting a temperature detection voltage from a temperature sensor is input and that performs capacitance control on the variable capacitance circuit based on the temperature data, wherein
   the processing circuit receives first temperature data as the temperature data and second temperature data subsequent to the first temperature data and switches first capacitance control data corresponding to the first temperature data and second capacitance control data different from the first capacitance control data in a time-division manner in a period between a start of capacitance control based on the first temperature data and a start of capacitance control based on the second temperature data to be output to the variable capacitance circuit, and
   the second capacitance control data is data different from the first capacitance control data by a predetermined value.

2. The circuit device according to claim 1, wherein
   the first capacitance control data is first integer data, and
   the second capacitance control data is second integer data obtained by adding or subtracting the predetermined value to or from the first integer data.

3. A circuit device comprising:
   an oscillation circuit that includes a variable capacitance circuit configured by a capacitor array and oscillates at an oscillation frequency corresponding to a capacitance value of the variable capacitance circuit;
   a processing circuit to which temperature data obtained by A/D converting a temperature detection voltage from a temperature sensor is input and that performs capacitance control on the variable capacitance circuit based on the temperature data, wherein
   the processing circuit receives first temperature data as the temperature data and second temperature data subsequent to the first temperature data and switches first capacitance control data corresponding to the first temperature data and second capacitance control data different from the first capacitance control data in a time-division manner in a period between a start of capacitance control based on the first temperature data and a start of capacitance control based on the second temperature data to be output to the variable capacitance circuit; and
   a memory that stores time-division pattern information, wherein
   the processing circuit switches the first capacitance control data and the second capacitance control data in a time-division manner based on the time-division pattern information read from the memory to be output to the variable capacitance circuit.

4. The circuit device according to claim 3, wherein
   the memory stores the temperature data and a capacitance adjustment value of the variable capacitance circuit in association with each other and stores decimal data of the capacitance adjustment value and the time-division pattern information in association with each other,
   the processing circuit reads the capacitance adjustment value corresponding to the temperature data from the memory and reads the time-division pattern information corresponding to the decimal data of the read capacitance adjustment value from the memory, and
   the processing circuit switches the first capacitance control data based on the capacitance adjustment value read from the memory, and the second capacitance control data that is integer data obtained by adding or subtracting a predetermined value to or from the first capacitance control data in a time-division manner based on the time-division pattern information read from the memory to be output to the variable capacitance circuit.

5. The circuit device according to claim 1, further comprising:
   a memory that stores the temperature data and a capacitance adjustment value of the variable capacitance circuit in association with each other, wherein
   the processing circuit obtains a capacitance adjustment value corresponding to the temperature data by reading a first capacitance adjustment value and a second capacitance adjustment value corresponding to upper bits of the temperature data and linearly interpolating the first capacitance adjustment value and the second capacitance adjustment value based on lower bits of the temperature data, and
   the processing circuit switches the first capacitance control data that is integer data of the capacitance adjustment value and the second capacitance control data in a time-division manner based on decimal data of the capacitance adjustment value to be output to the variable capacitance circuit.

6. The circuit device according to claim 1, wherein
   the processing circuit includes a digital filter that performs digital filtering on the temperature data, and
   the processing circuit controls the capacitance value of the variable capacitance circuit based on the temperature data after the digital filter processing.

7. The circuit device according to claim 1, wherein
   the capacitor array includes
   first to n-th capacitors (n is an integer of 2 or more) weighted in binary,
   first to n-th switches having one end coupled to one end of the first to n-th capacitors and the other end coupled to an output node or an input node of a drive circuit of the oscillation circuit,
   a switching capacitor, and
   a switching switch having one end coupled to one end of the switching capacitor and the other end coupled to the output node or the input node of the drive circuit,
   on/off states of the first to n-th switches do not change between when the first capacitance control data is input and when the second capacitance control data is input, and
   the switching switch is turned to one of on or off when the first capacitance control data is input, and is turned to the other of on or off when the second capacitance control data is input.

8. An oscillator comprising:
   the circuit device according to claim 1; and
   a resonator that is electrically coupled to the oscillation circuit and oscillates by the oscillation circuit.

9. A real-time clock device comprising:
a temperature sensor that generates a temperature detection voltage;
an A/D conversion circuit that generates temperature data by A/D converting the temperature detection voltage;
an oscillation circuit that includes a variable capacitance circuit configured by a capacitor array and oscillates at an oscillation frequency corresponding to a capacitance value of the variable capacitance circuit;
a memory that stores a capacitance adjustment value corresponding to the temperature data;
a processing circuit that controls the capacitance value of the variable capacitance circuit based on the temperature data and the capacitance adjustment value; and
a clocking circuit that generates time information based on a clock signal output from the oscillator circuit,
wherein
the capacitor array includes a plurality of capacitors and a switching switch that is coupled to one of the plurality of capacitors, and
the processing circuit controls the capacitance value of the variable capacitance circuit with a resolution smaller than a minimum capacitance value of the plurality of capacitors by controlling the switching switch in a time-division manner.

10. The real-time clock device according to claim 9, wherein
the processing circuit is configured to
perform digital filtering on the temperature data, and
obtain the capacitance adjustment value corresponding to the digitally filtered temperature data by performing interpolation processing on the capacitance adjustment value stored in the memory.

11. The real-time clock device according to claim 10, wherein
the memory stores time-division pattern information corresponding to lower bits of the capacitance adjustment value obtained by the interpolation processing, and
the processing circuit controls the switching switch based on the time-division pattern information.

12. The real-time clock device according to claim 9, wherein
the plurality of capacitors include
first, second, . . . , n-th capacitors (n is an integer of 2 or more) that have capacitance values of C0, 2 x C0, . . . , $2^{n-1}$ x C0,
first to n-th switches that are respectively coupled in series to the first to nth capacitors, and
a switching capacitor that has a capacitance value of C0,
the switching switch is coupled in series to the switching capacitor, and
the switching switch is controlled to be turned on and off in a shorter cycle than the first to n-th switches.

13. An electronic device comprising:
the circuit device according to claim 1; and
a processing device that operates based on an output signal from the circuit device.

14. A vehicle comprising:
the circuit device according to claim 1; and
a processing device that operates based on an output signal from the circuit device.

* * * * *